Jan. 5, 1971 K. W. CATTERMOLE 3,553,677

ANALOG TO DIGITAL CONVERTER

Filed Oct. 13, 1967 3 Sheets-Sheet 1

Inventor
KENNETH W. CATTERMOLE
By Alfred C. Hill
Agent

Inventor
KENNETH W. CATTERMOLE
By Alfred C. Hill
Agent

Jan. 5, 1971 K. W. CATTERMOLE 3,553,677

ANALOG TO DIGITAL CONVERTER

Filed Oct. 13, 1967 3 Sheets-Sheet 3

Inventor
KENNETH W. CATTERMOLE
By Alfred C. Hill
Agent

United States Patent Office
3,553,677
Patented Jan. 5, 1971

3,553,677

ANALOG TO DIGITAL CONVERTER

Kenneth William Cattermole, Harlow, England, assignor to International Standard Electric Corporation, New York, N.Y., a corporation of Delaware Filed Oct. 13, 1967, Ser. No. 675,234
Claims priority, application Great Britain, Oct. 17, 1966, 46,295/66
Int. Cl. H03k 13/02
U.S. Cl. 340—347 10 Claims

ABSTRACT OF THE DISCLOSURE

The passage of a high field domain of the Gunn effect through a suitably grooved semiconductor, or a semiconductor provided with additional contact areas on a major surface thereof generates a series of pulses. In a tapered, or suitably doped semiconductor, the domain propagates for distance dependent on the magnitude of applied bias which is proportional to the analog signal. The number of grooves or additional contact areas are arranged in the sequence of a chain code of $n$-digits. The code character corresponding to the analog signal then appears serially in the last $n$-time slots before the domain is extinguished.

BACKGROUND OF THE INVENTION

The invention relates to analog-to-digital converters, such as coders which are used in pulse code modulation (P.C.M.) systems of telecommunication, and more particularly to such converters employing semiconductor devices including semiconductive material exhibiting moving high field instability effects.

If a crystal of one of certain semiconductive materials is subjected to a steady electric field exceeding a critical value the resultant current flowing through the crystal contains an oscillatory component of frequency determined by the transit of a space charge distribution between the crystal contact areas. The phenomenon occurs at ordinary temperatures, does not require an applied magnetic field and does not appear to involve a special specimen doping or geometry. This phenomenon was first reported by J. B. Gunn in Solid State Communications, vol. 1, page 88, 1963 and is, therefore, known as the Gunn effect. The Gunn effect arises from the heating of electrons, normally in a low effective mass, high mobility sub-band (K=0), by the electric field and consequent transfer into a higher effective mass, lower mobility sub-band (K=100). This process gives rise to an electron drift velocity (or current) versus applied field characteristic with a region of negative differential conductivity. For an applied bias within the negative conductance region, a high field region, termed a domain, moves from cathode to anode during one cycle of current oscillation. The frequency of oscillation is determined primarily by the length of the current path through the crystal. The phenomenon has been detected in III–V semiconductors, such as gallium arsenide and indium phosphide having n-type conductivity.

The term "semiconductive material exhibiting high field instability effects" is used herein to include at least any material exhibiting the Gunn effect as defined in the preceding paragraph or exhibiting similar functional phenomena which may be based on somewhat different internal mechanisms.

The value of the applied field below which spontaneous self-oscillation does not occur can be termed the Gunn threshold value.

SUMMARY OF THE INVENTION

A feature of the present invention is the provision of an analog to digital converter including a body of semiconductive material exhibiting high field instability effects, the resistance of the conducting cross-sectional area of said body being increased along the major axis thereof from a minimum value at one end thereof to a maximum value at the other end thereof; a pair of contact areas disposed in spaced relation on the body; a source of bias proportional to an analog input signal coupled to the pair of contact areas to produce a steady electric field in the body, the value of the electric field exceeding the instability threshold value of the body at least locally therein to form a high field domain within the body which propagates therealong a distance determined by the magnitude of the analog input signal before extinguishing; and output means in a predetermined relationship with the body responsive to the propagating high field domain to produce a series of output pulses, the last $n$-output pulses before the high field domain extinguishes being in a distinct digital pattern representative of the magnitude of the analog input signal, where $n$ is an integer greater than one.

Another feature of this invention is the provision of an analog to digital converter as set forth in the preceding paragraph wherein the output means includes a plurality of grooves disposed in space relation in a surface of the body parallel to the major axis, grooves being disposed in transverse relation to the major axis; and an output circuit coupled to each of the grooves to provide a pulse when the propagating high field domain encounters each of the grooves, the magnitude of each of the pulses being determined by the depth ofthe grooves.

Still another feature of this invention is the provision of an analog to digital converter as set forth in the next to last paragraph above wherein said output means includes at least one other contact area disposed between the pair of contact areas adjacent to but insulated from a surface of the body, the other contact area providing an output pulse when the propagating high field domain encounters the other contact area.

Since the operation of the arrangement is independent of the pulse repetition frequency, provided this is lower than the Gunn effect self-oscillatory frequency, the arrangement is capable of handling signals of variable frequency, such as wide band frequency modulated signals, the upper frequency limit in typical devices being of the order of $10^9$ cycles per second.

BRIEF DESCRIPTION OF THE DRAWINGS

The above mentioned and other features and objects of this invention will become more apparent by reference to the following description taken in conjunction with the accompanying drawings, in which.

DffSCRIPTION OF THE PREFERRED EMBODIMENTS

If a crystal of semiconductive material which exhibits the Gunn effect as defined in the preceding paragraphs has applied thereto a unidirectional field E to provide a potential difference of controllable value across the crystal with a normal steady state value E bias and if the value of this applied field which is greater than a lower threshold field value E min. for the material is caused to exceed the threshold value E threshold at least locally within the body for a time shorter than the instability transit time between the spaced contacts (between which the unidirectional field E bias is applied) the current passed through the crystal by the unidirectional field is caused to deviate from its steady state value thereby causing the material to be in an unstable state due to the formation of a high field instability region. This basic transferred electron mechanism is illustrated in the curve of FIG. 1.

In the case of gallium arsenide this lower threshold value is about 50% of the threshold for continuous Gunn effect oscillations. The steady field may be continuously applied, or may be pulsed to reduce the total power dissipation in the device.

Figure 1:
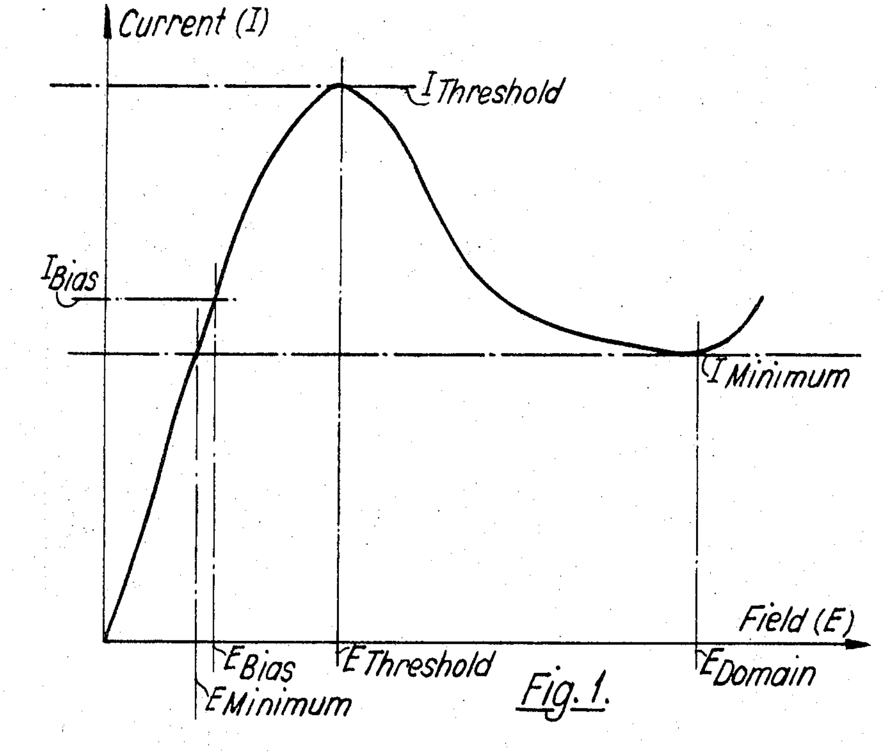
FIG. 1 shows a current (I) versus field (E) curve for the basic transfer electron mechanism according to the invention.
Figure 2:
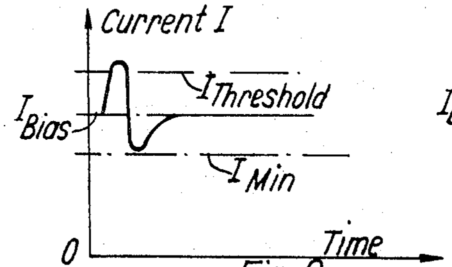
FIGS. 2 to 5 show typical waveforms produced by a device according to the invention.

If I bias is arranged to be just above I min., as shown in the curve of FIG. 1, then the domain will break up as soon as it enters a region of lower resistivity and E bias falls below E min. This is illustrated in the waveform shown in FIG. 2.

Figure 4:
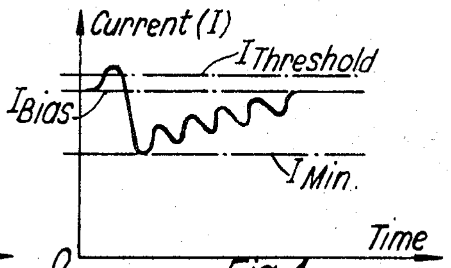
Figure 3:
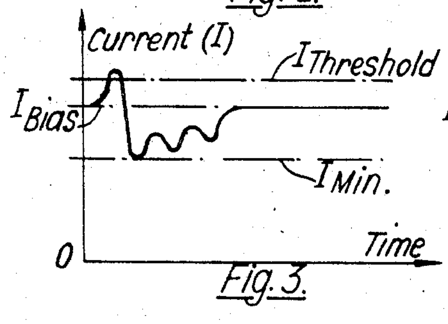

However, if I bias is such that the domain travels through several field troughs before a value below E min. is reached, then several minor pulses appear as shown in FIG. 3, because as the domain propagates along the crystal it is presented with an increasing resistance path. There is, of course, a minimum value to which the magnitude of the minor pulses would fall and this would be determined by the characteristics of the semiconductive material used. For slightly higher values of I bias, the resulting waveform would be as shown in FIG. 4.

Figure 5:
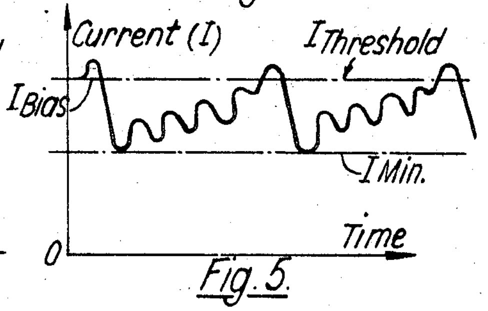

When the original current pulse due to the first high field instability region has propagated the full length of the crystal and provided the potential across the device is maintained in excess of the threshold value, the semiconductive material will momentarily return to its unstable state before the sequence is repeated as shown in FIG. 5. Therefore, by maintaining the potential across the crystal above the threshold value a continuous process will result to provide a continuous train of output pulses.

If the impedance of the crystal of semiconductive material is graded down, then the domain, or high field instability region, would travel a distance which is determined by the applied bias and the point at which the field drops below E min. Thus, by using this technique it is possible to produce solid state coder units which could be adapted for use in, for example, analog to digital conversion applications.

Figure 6:
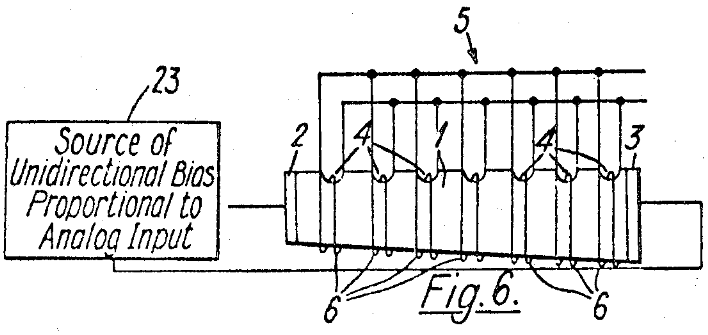
FIG. 6 shows diagrammatically a solid state analog to digital converter which is produced by varying the resistivity of the conducting cross-sectional area of the semiconductor body.

Referring to FIG. 6, a solid state analog to digital converter is shown diagrammatically and consists of a wedge-shaped crystal 1 of semiconductive material with the necessary electrical properties, for example, n-type gallium arsenide having ohmic contact areas 2 and 3 secured to its plane end faces.

Strips or grooves 4 are etched or air abraded into one longitudinal face of the crystal 1 to form sections of varying conductivity along the length of crystal 1.

In practice, crystal 1 may be formed on a semi-insulating substrate, for example, gallium arsenide by epitaxial growth, or alternatively a solid piece of semiconductive material could be used. Contact areas 2 and 3, for example, tin, are formed on the end faces of crystal 1, for example, by vacuum evaporation. The device is then heat treated, in a reducing atmosphere containing a fluxing agent, to alloy the metal-semiconductor joint and form an ohmic junction.

Source 23 of unidirectional bias proportional to analog input is used to apply a potential difference of control value between contact areas 2 and 3, and output circuit 5 including, for example, inductance coils 6 is used to extract any oscillatory component of the current flowing in crystal 1.

The phenomenon known as the Gunn effect manifests itself by the appearance in output circuit 5 of an oscillatory component in the current through crystal 1 when the potential difference applied across crystal 1 is caused to exceed a critical value. In the arrangement shown in FIG. 6, the potential applied between contact areas 2 and 3 causes the material to be in an unstable state and is chosen so that when the electric field due to the applied potential encounters the first of grooves 4 a high field instability region is formed thereby returning the material to its stable state again. The current passed through this region is caused to undergo a single excursion from its steady state value due to the formation of this high field instability region, i.e., the threshold value is exceeded. This high field domain which manifests itself in output circuit 5 in the form of a current pulse, will then propagate along crystal 1, the distance travelled being determined by the applied bias and the point at which the field drops below E min. During the propagation, the high field domain on encountering the remaining grooves 4, again causes the current to undergo single excursions from its normal steady state value at each of the remaining grooves 4. Because of the variation in the cross-sectional area of the device, the magnitude of this series of pulses is less than the pulse due to the first high field instability region because of the increased resistance which is presented to the electric field, but there is, of course, a minimum value to which the magnitude of these pulses would fall and this will be determined, as previously stated, by the material.

Figure 7:
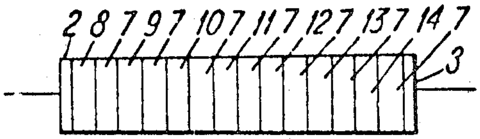
FIG. 7 shows diagrammatically a solid state analog to digital converter which is produced by diffusing dopants into selected areas of the semiconductor body to modify its conductivity.

Referring to FIG. 7, a solid state coder unit is shown diagrammatically. This is an alternative form of the arrangement shown in FIG. 6. The construction of this device is as detailed for the analog to digital converter shown in FIG. 6, except crystal 1 is formed of parallel sided discs and the conductivity of the material is varied by doping crystal 1 with a suitable dopant to produce regions of varying resistivity. Regions 7 are of the same resistivity, but regions 8 to 14 are arranged such that the resistivity of each successive region is progressively increased thereby simulating the conditions obtained in the analog to digital converter shown in FIG. 6. The operation of this device is exactly the same as detailed for the analog to digital converter shown in FIG. 6.

Figure 8:
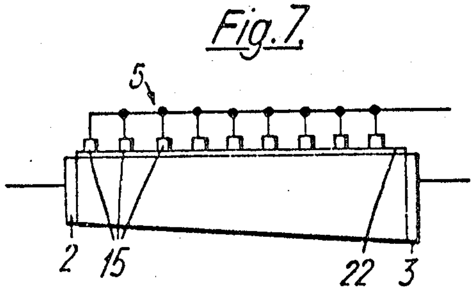
FIG. 8 shows diagrammatically an alternative solid state analog to digital converter in which the domain voltage is sensed by one or more electrodes along the semiconductor body.

Referring to FIG. 8, a solid state analog to digital converter in which the domain, or high field instability region is sensed by one or more electrodes along the device is shown diagrammatically. The construction of this device is exactly as detailed for the unit shown in FIG. 6, except the grooves 4 are omitted and output circuit 5 is changed. A further series of contact areas 15 are deposited on one of the major surfaces of semiconductor crystal 1 and electrically insulated from it by a thin layer of insulating material 22, such as silica. The multiple electrodes are, thus, situated near the high field instability region in the device and as the high field domain, which, as previously stated, manifests itself in the form of sharp current pulses in output circuit 5, propagates along the device, it is sensed by each of contact areas 15 in turn and capacitively coupled to the output by way of layer 22 to produce a series of output pulses. Again, the distance travelled by the high field instability region is determined by the applied bias and the point at which the field drops below E min.

Thus, it can be seen from the above that when a variable analog input signal is applied to the solid state devices shown in FIGS. 6, 7 and 8 a distinctive digital output pattern is obtained, i.e., a train of uniform pulses which may be counted to provide a digital measure of the input signal.

Figure 9:
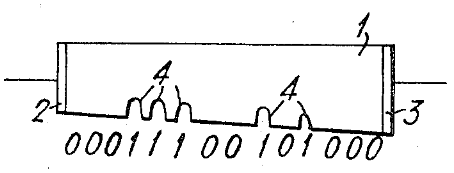
FIG. 9 shows diagrammatically an alternative arrangement for the solid state analog to digital converter shown in FIG. 6.

Referring to FIG. 9, a solid state analog to digital converter is shown diagrammatically which is an alternative arrangement for the analog to digital converter shown in FIG. 6. In this arrangement, strips or grooves 4 are arranged in the form of a chain code with a groove 4 present for each mark (denoted by 1) in the code, but absent for each space (denoted by 0). Since the variable analog input signal is directly related to the distance travelled by the high field instability region along the device then the last few digits before extinction of the high field instability region would give a coded representation of the magnitude of the variable analog input signal.

Figure 10:
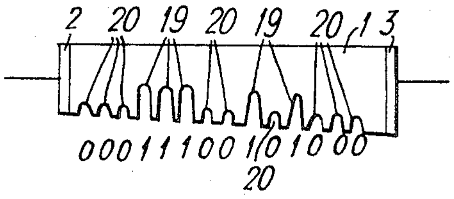
FIG. 10 shows diagrammatically a further alternative arrangement for the solid state analog to digital converter shown in FIG 6.

Since it is necessary that the high field instability region be able to extinguish itself at a point corresponding to a space, it is necessary to provide a further groove for each space in the code thereby ensuring that for a given analog input signal the propagating high field instability region will travel a fixed distance before being extinguished by a groove to provide a distinct digital output pattern for this analog input signal. In order to achieve this mode of operation, it will be necessary as shown in FIG. 10 to have deep grooves 19 and shallow grooves 20 for marks and spaces, respectively; and possibly to provide a wider pitch for spaces than for marks. The output would then consist of large and small pulses for marks and spaces, respectively, so regeneration would be necessary.

A chain code is constructed in the following way. Each of N levels is defined as a sequence of $n$ digits, where $2^n \geqslant N$. The first $(n-1)$ digits of any level are the same as the last $(n-1)$ digits of the previous level. A very simple example of a two digit chain code is shown below.

| Level No.: | Digits |
|---|---|
| 1 | 00 |
| 2 | 01 |
| 3 | 11 |
| 4 | 10 |

This gives a periodic sequence 001100110011.

The code can be chosen (as in the above example) such that the first level could be repeated after the last level without breaking the rule that the first $(n-1)$ digits of any level are the same as the last $(n-1)$ digits of the previous level. Thus, if a sequence consisting of any column of the table is repeated periodically, any adjacent set of $N+n-1$ elements may be chosen from it and taken as the basis for a code.

The N subsets of $n$ adjacent elements are all different and correspond to the characters of the code. In the above example, the five elements could be 00110, and the adjacent pairs of elements are the characters shown in the above table.

Sequences for several non-redundent codes are shown tabulated below:

| Number of digits (n) | Number of levels (N) | Basic sequence |
|---|---|---|
| 2 | 4 | 0011(0) |
| 3 | 8 | 00011101(00) |
| 4 | 16 | 0000101001111011(000) |
| 5 | 32 | 00000100101011101000110011111011(0000) |

In the above table, the basic N-element sequence is follower (in brackets) by $(n-1)$ elements repeated from the beginning, so that the whole gives directly a suitable arrangement for grooves 4 of the analog to digital converters shown in FIGS. 9 and 10. It should be noted that the sequence may be started at an arbitrary point, or complemented, or reversed, if there is any instrumental advantage in so doing. Sequences for non-redundent codes of more digits, and for certain redundant codes may also be employed.

The solid state analog to digital converter shown in FIG. 8 may also be adapted to operate in accordance with the chain code. This could be arranged by having a contact area 15 present for each mark in the code, but absent for each space. If two sets of contact areas 15 are provided on semiconductor crystal 1 each one of which is arranged in a different pattern, then this would permit a wider range of chain codes to be obtained from a single unit.

Figure 11:
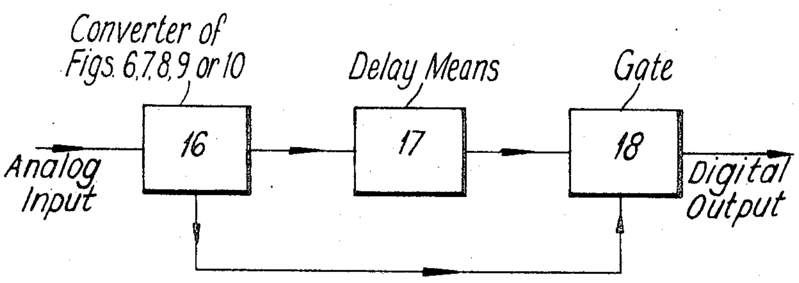
FIG. 11 shows a block diagram of an analog to digital converter system which utilizes the converter shown in FIGS. 6, 7, 8, 9 and 10.

The block diagram of a practical analog to digital converter system which utilizes the analog to digital converters shown in FIGS. 6, 7, 8, 9 and 10 is shown in FIG. 11. The digital output from the analog to digital converter 16 is passed to delay means 17 which is capable of storing the last $n$-digits of the digital output. The output from delay means 17 is taken to gate 18 which is operated by the analog to digital converter 16 when the high field instability region therein extinguishes itself. Thus, the last $n$-digits of the digital signal before extinction are passed to the output circuit. The digital output passed through delay means 17 before extinction of the high field instability region is dissipated in the input circuit of gate 18.

The practical problems involved in handling the very short duration output pulse for use in, say, pulse code modulation system of telecommunication may be overcome by detecting the output stroboscopically. This would require each analog signal sample to be coded many times in succession, which would be possible in view of the high speed of the phenomenon.

While I have described above the principles of my invention in connection with specific apparatus it is to be clearly understood that this description is made only by way of example and not as a limitation to the scope of my invention as set forth in the objects thereof and in the accompanying claims.

I claim:

1. An analog to digital converter comprising:

an elongated body of semiconductive material exhibiting high field instability effects, the resistance of the conducting cross-sectional area of said body being increased along the major axis thereof from a a minimum value at one end thereof to a maximum value at the other end thereof;

a pair of contact areas each connected to opposite ends of said body;

a source of bias proportional to an analog input signal coupled to said pair of contact areas to produce a steady electric field in said body between said contact areas, the value of said electric field exceeding the instability threshold value of said body at least locally therein to form a high field domain within said body which propagates within and along the length of said body a distance determined by the magnitude of said input signal before extinguishing; and output means disposed along the length of and in a predetermined coupled relationship with said body between said contact areas responsive to said propagating high field domain to produce a series of output pulses, the last $n$-output pulses before said high field domain extinguishes being in a distinct digital pattern representing the magnitude of said input signal, where $n$ is an integer greater than one.

2. A converter according to claim 1, wherein said output means includes:

a plurality of grooves disposed in spaced relation in a surface of said body parallel to said major axis, said groves being disposed in transverse relation to said major axis; and an output circuit coupled to each of said grooves to provide a pulse when said propagating high field domain encounters each of said grooves, the magnitude of each of said pulses being determined by the depth of said grooves.

3. A converter according to claim 2, wherein two sets of grooves are provided in said surface of said body, each set of grooves having a different depth.

4. A converter according to claim 3, wherein one set of said two sets of grooves represents the marks of a code, and the other set of said two sets of grooves represents the spaces of said code.

5. A converter according to claim 1, wherein said output means includes at least one other contact area disposed between said pair of contact areas adjacent to but insulated from a surface of said body, said other contact area providing an output pulse when said propagating high field domain encounters said other contact area.

6. A converter according to claim 5, wherein a plurality of said other contact areas are provided, each of said other contact areas providing an output pulse when said propagating high field domain encounters each of said other contact areas.

7. A converter according to claim 6, further including a thin layer of insulating material to insulate said other contact areas from said surface of said body.

8. A converter according to claim 1, wherein said body is wedge-shaped to increase said resistance along said major axis from a minimum value at one end thereof to a maximum value at the other end thereof.

9. A converter according to claim 1, wherein said body is selectively diffused with dopants to produce areas of different resistance along said major axis to increase said resistance along said major axis from a minimum value at one end therof to a maximum value at the other end thereof.

10. A converter according to claim 1, further including a delay means coupled to said output means, said delay means storing said last *n*-output pulses; and gating means coupled to said output means and said delay means to pass said last *n*-output pulses therethrough when said propagating high field domain is extinguished.

References Cited

UNITED STATES PATENTS

| | | | |
|---|---|---|---|
| 3,365,583 | 1/1968 | Gunn | 317—234X |
| 3,434,008 | 3/1969 | Sandbank | 317—234X |
| 3,453,502 | 7/1969 | Sandbank | 317—234X |
| 3,453,560 | 7/1969 | Swartz | 317—234X |
| 3,462,617 | 8/1969 | Masakazu Shoji | 317—234X |

MAYNARD R. WILBUR, Primary Examiner

C. D. MILLER, Assistant Examiner

U.S. Cl. X.R.

317—234